(12) United States Patent
Kim et al.

(10) Patent No.: US 8,208,291 B2
(45) Date of Patent: Jun. 26, 2012

(54) SYSTEM AND METHOD TO CONTROL A DIRECTION OF A CURRENT APPLIED TO A MAGNETIC TUNNEL JUNCTION

(75) Inventors: Jung Pill Kim, San Diego, CA (US); Hari M. Rao, San Diego, CA (US); Kangho Lee, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 240 days.

(21) Appl. No.: 12/687,310

(22) Filed: Jan. 14, 2010

(65) Prior Publication Data
US 2011/0170338 A1 Jul. 14, 2011

(51) Int. Cl.
*G11C 11/00* (2006.01)
(52) U.S. Cl. .......... 365/158; 365/171; 365/209
(58) Field of Classification Search .......... 365/157, 365/209
See application file for complete search history.

(56) References Cited

U.S. PATENT DOCUMENTS

| | | | | |
|---|---|---|---|---|
| 5,793,697 | A * | 8/1998 | Scheuerlein | 365/230.07 |
| 6,034,887 | A | 3/2000 | Gupta et al. | |
| 6,529,404 | B2 * | 3/2003 | Hidaka | 365/171 |
| 7,292,468 | B2 * | 11/2007 | Iwata | 365/158 |
| 7,839,676 | B2 * | 11/2010 | Kurose et al. | 365/171 |
| 2006/0023490 | A1 | 2/2006 | Boeve | |
| 2007/0091671 | A1 | 4/2007 | Ooishi et al. | |
| 2009/0244056 | A1 | 10/2009 | Tsuchi | |

OTHER PUBLICATIONS

Takayuki, et al. "2 Mb SPRAM (Spin—Transfer Torque RAM) With Bit-by-Bit Bi-Directional Current Write and Parallelizing—Direction Current Read", IEEE Journal of Solid-State Circuits, vol. 43, No. 1, Jan. 2008; pp. 109-120.
International Search Report and Written Opinion—PCT/US2011/021380, International Search Authority—European Patent Office—Mar. 31, 2011.
Kawahara T, et al., "2Mb Spin-Transfer Torque RAM (SPRAM) with Bit-by-Bit Bidirectional Current Write and Parallelizing-Direction Current Read", 2007, IEEE International Solid-State Circuits Conference (IEEE CAT. No. 07CH37858), IEEE, Piscataway, NJ, USA Feb. 1, 2007, pp. 480-617, XP031180181, DOI:10.1109/ISSCC.2007.373503 ISBN: 978-1-4244-0852-8.

* cited by examiner

*Primary Examiner* — Tan T. Nguyen
(74) *Attorney, Agent, or Firm* — Sam Talpalatsky; Nicholas J. Pauley; Jonathan T. Velasco

(57) ABSTRACT

A system and method to control a direction of a current applied to a magnetic tunnel junction is disclosed. In a particular embodiment, an apparatus comprises a magnetic tunnel junction (MTJ) storage element and a sense amplifier. The sense amplifier is coupled to a first path and to a second path. The first path includes a first current direction selecting transistor and the second path includes a second current direction selecting transistor. The first path is coupled to a bit line of the MTJ storage element and the second path is coupled to a source line of the MTJ storage element.

40 Claims, 7 Drawing Sheets

SYSTEM AND METHOD TO CONTROL A DIRECTION OF A CURRENT APPLIED TO A MAGNETIC TUNNEL JUNCTION

I. FIELD

The present disclosure is generally related to controlling a direction of a current applied to a magnetic tunnel junction.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application that can be used to access the Internet. As such, these wireless telephones can include significant computing capabilities.

A magnetic tunnel junction (MTJ) may be used by computing devices as part of a memory device, such as a magnetoresistive random access memory (MRAM) or a spin torque transfer MRAM (STT-MRAM). In an MTJ, a tunneling barrier, such as a thin MgO film, is inserted between two magnetic layers, where one magnetic layer is a pinned layer with a fixed magnetization and the other is a free layer with a direction of magnetization that can rotate. Due to the tunnel magnetic resistance (TMR) effect, the resistance of the MTJ changes corresponding to the alignment of magnetization of the two layers (i.e., a parallel state and an anti-parallel state). The resistance values of each of the two states may be used to correspond to data values (e.g., a logic value of "1" or "0").

In an STT-MRAM, the MTJ is placed in an anti-parallel state when a current flowing through the MTJ is increased beyond a threshold in an anti-parallelizing direction. In contrast, the MTJ is placed in a parallel state when the current is increased beyond a threshold in a parallelizing direction. The state of the MTJ may be determined based on a read current that flows through the MTJ that is large enough to determine the resistive state of the MTJ but small enough to not cause the MTJ to change states. In a read operation, a read disturbance may occur when the read current exceeds a read disturb threshold and performs a write to the MTJ. For example, a read current flowing in an anti-parallelizing direction may change the state of the MTJ from a parallel state to an anti-parallel state and a read current flowing in a parallelizing direction may change the state of the MTJ from an anti-parallel state to a parallel state.

The probability of a read disturbance in an MTJ depends in part upon a direction of the read current and a configuration of the MTJ. The configuration of the MTJ may include a state of the MTJ that has been thermally adjusted. For example, in a circuit that includes an MTJ with a parallel state that is thermally adjusted to facilitate parallel to anti-parallel switching, a parallelizing read current may result in fewer read disturbances than an anti-parallelizing read current. In another MTJ circuit configuration where the thermal stability of the MTJ has been adjusted to facilitate anti-parallel to parallel switching, an anti-parallelizing read current may result in fewer read disturbances than a parallelizing read current.

III. SUMMARY

In a particular embodiment, a circuit is disclosed that may read an MTJ storage element using a parallelizing read current or an anti-parallelizing read current. The circuit may selectively read the MTJ storage element in either a parallelizing direction or an anti-parallelizing direction. The circuit may enable a sense amplifier to select a read current direction that may have a lower probability of creating read disturbances during a read operation of the MTJ.

In a particular embodiment, an apparatus comprises a magnetic tunnel junction (MTJ) storage element and a sense amplifier. The sense amplifier is coupled to a first path, to a second path, and to a reference circuit. The first path includes a first current direction selecting transistor and the second path includes a second current direction selecting transistor. The first path is coupled to a bit line of the MTJ storage element and the second path is coupled to a source line of the MTJ storage element.

In a particular embodiment, a method of controlling a direction of a current to be applied to an MTJ cell of a memory device is disclosed. The method includes activating a switch in a first current path that is coupled to the MTJ cell during a read operation. Upon activating the switch, current flows through the MTJ cell in a selected direction.

One particular advantage provided by at least one of the disclosed embodiments is the ability of a sense amplifier to select a direction of a read current that reduces a probability of read disturbances for a particular MTJ.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

Figure 6:
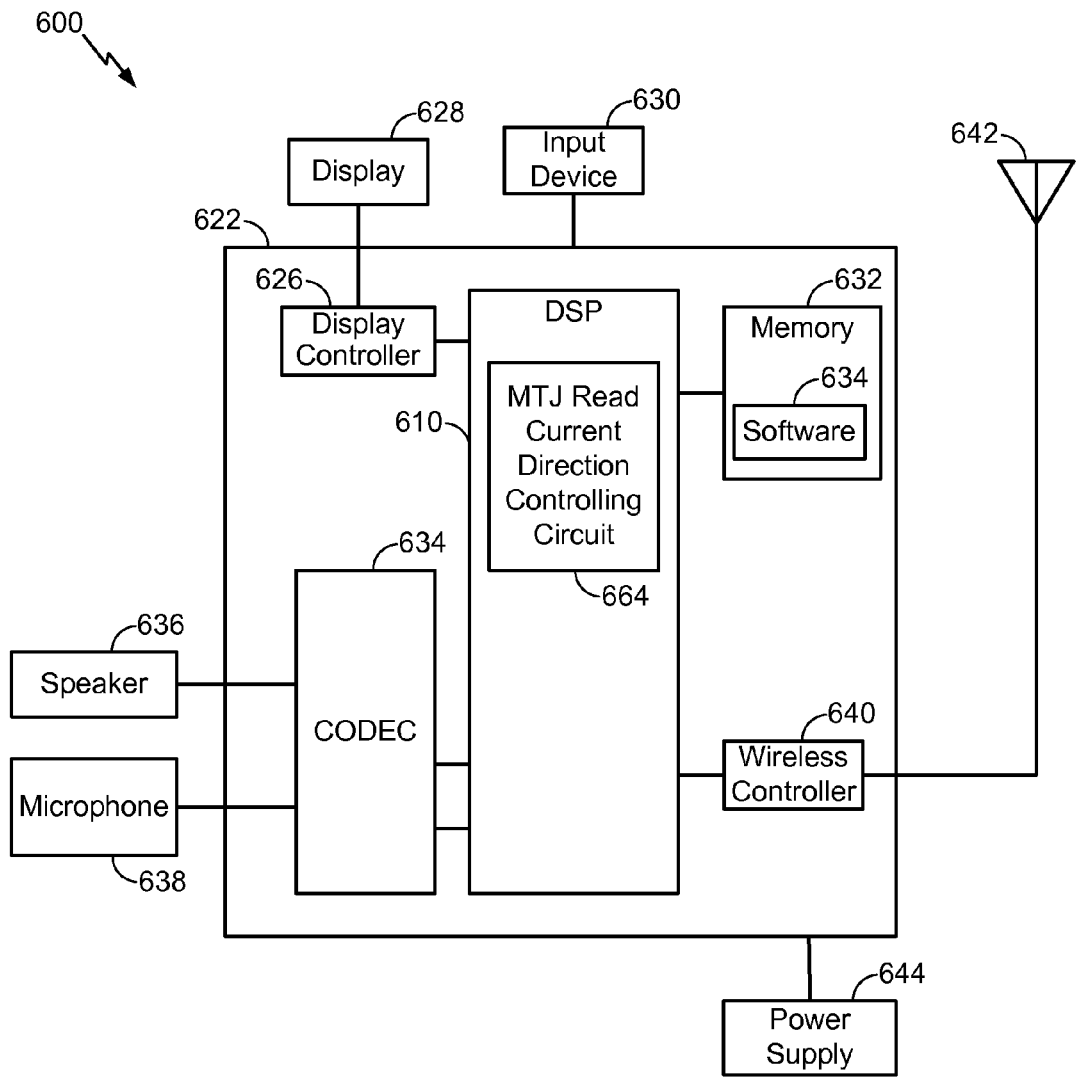
Figure 7:
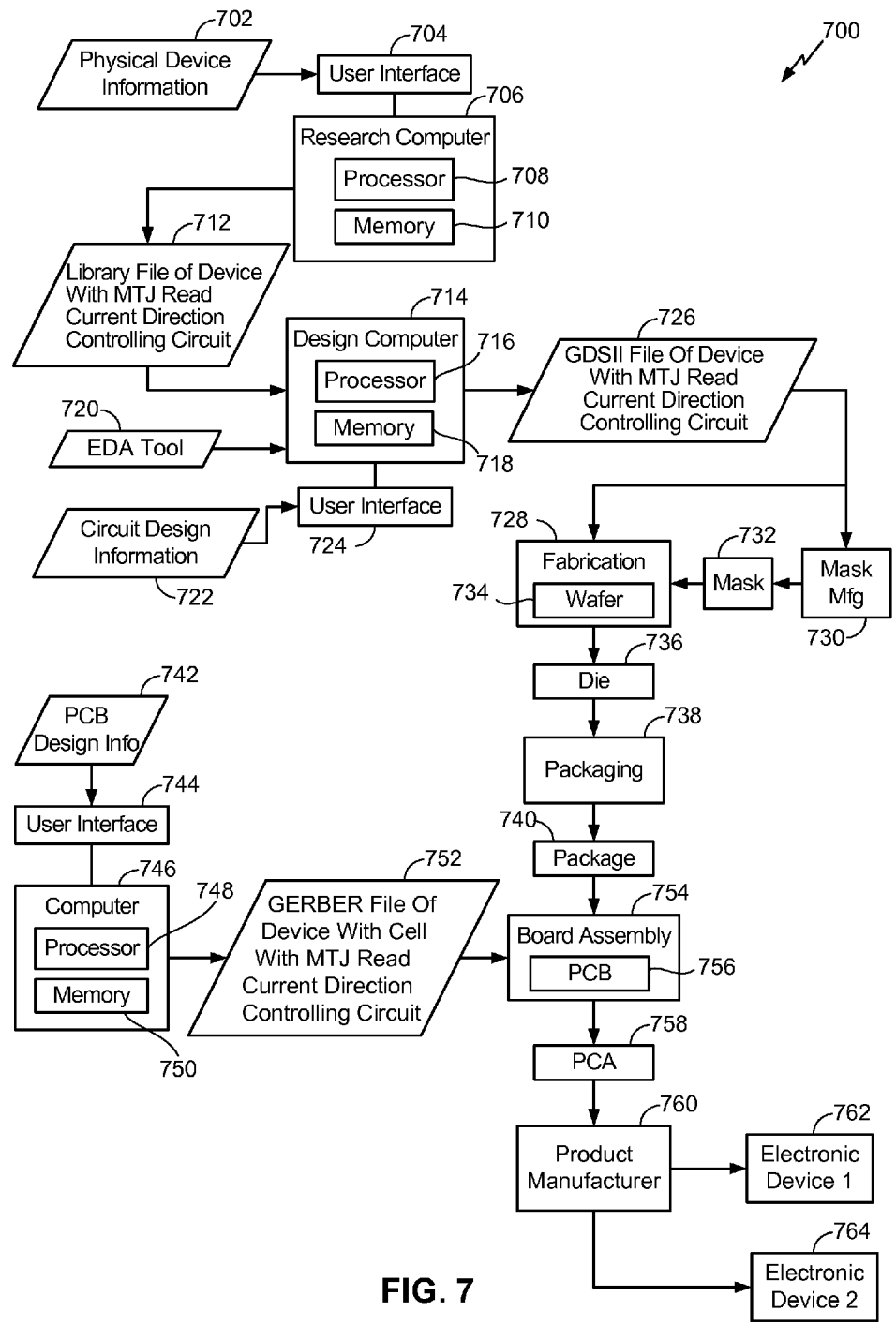

FIG. 6 is a block diagram of a particular embodiment of a wireless communication device that includes a circuit that controls a direction of a read current to be applied to a magnetic tunnel junction; and FIG. 7 is a data flow diagram illustrating a manufacturing process for use with a device that includes a circuit that controls a direction of a read current to be applied to a magnetic tunnel junction.

V. DETAILED DESCRIPTION

Figure 1:
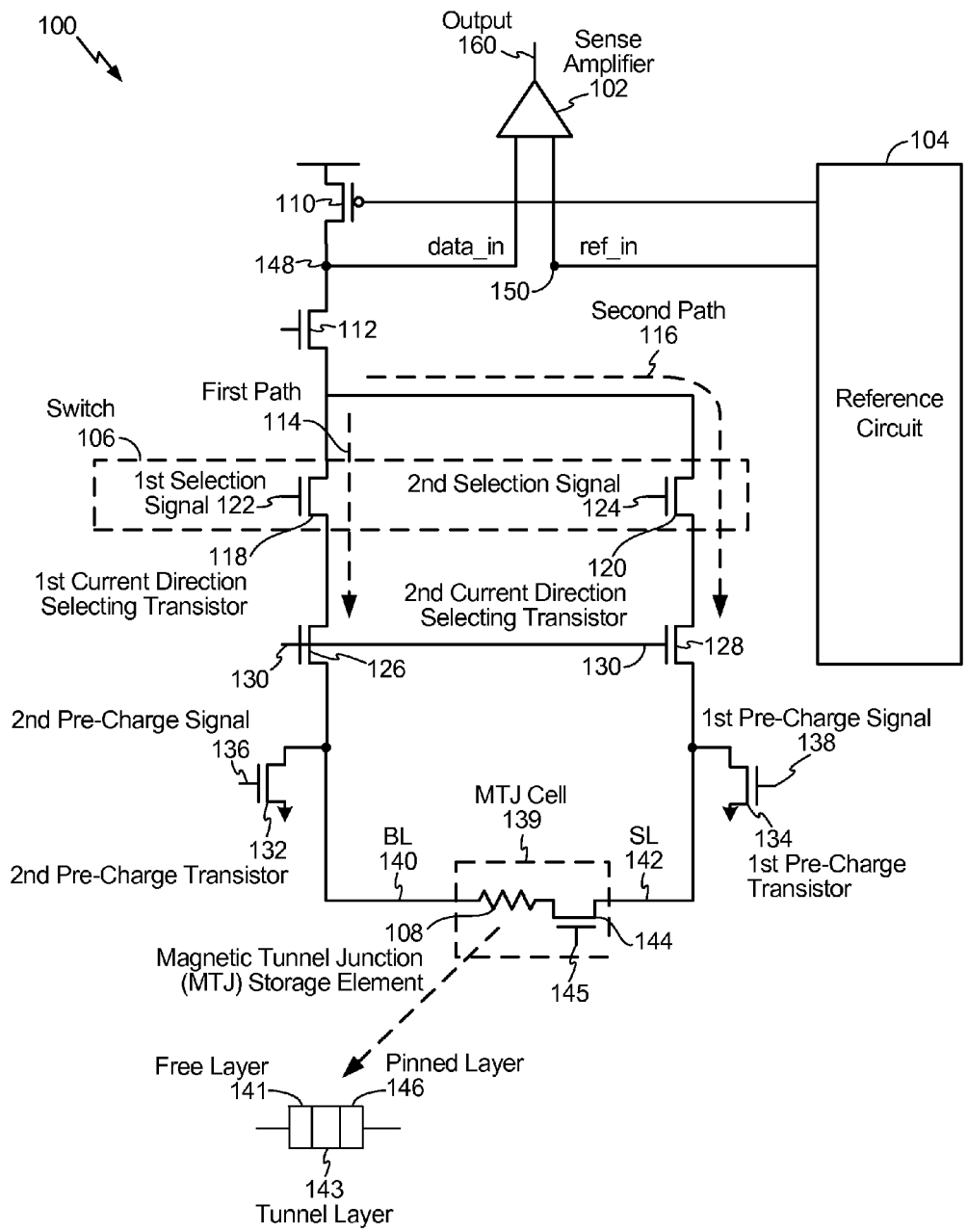
FIG. 1 is a diagram of a particular illustrative embodiment of a circuit that controls a direction of a read current to be applied to a magnetic tunnel junction (MTJ)

Referring to FIG. 1, a particular illustrative embodiment of a circuit that controls a direction of a read current to be applied to a magnetic tunnel junction (MTJ) is disclosed and generally designated 100. The circuit 100 includes a sense amplifier 102 coupled to a first node 148 and a second node 150. The first node 148 enables the sense amplifier 102 to sense a data input (data_in) voltage based on a current through an MTJ storage element 108 of an MTJ cell 139. The second node 150 enables the sense amplifier 102 to sense a reference input (ref_in) voltage generated by a reference circuit 104.

In a particular embodiment, the ref_in voltage at the second node 150 is a reference data value that corresponds to a voltage that is less than a logic one value associated with the MTJ storage element 108 and greater than a logic zero value associated with the MTJ storage element 108. For example, the ref_in voltage may be substantially at a midpoint between a high data voltage and a low data voltage. The sense amplifier 102 is configured to compare the data input (data_in) voltage and the reference voltage (ref_in) to determine a state of the MTJ storage element 108 and to generate an output 160 based on the comparison. For example, in response to a determination that the data_in voltage is greater than the ref_in voltage, the output 160 of the sense amplifier 102 may indicate that the MTJ storage element 108 is in an anti-parallel state, which may correspond to a logic state of "1". In response to determining that the data_in voltage is less than the ref_in voltage, the output 160 may indicate that the MTJ storage element 108 is in a parallel state, which may correspond to a logic state of "0".

In a particular embodiment, the first node 148 is coupled to a load device, such as a p-channel metal oxide semiconductor (PMOS) field effect transistor load device 110. The PMOS load device 110 is coupled to the MTJ storage element 108 via one of a first path 114 and a second path 116. The data_in voltage at the first node 148 may be a voltage generated by the PMOS load device 110 in response to a resistance value of the MTJ storage element 108.

The PMOS load device 110 is also coupled to a clamp transistor 112. The clamp transistor 112 may be configured to limit current and voltage delivered to the MTJ storage element 108. A switch 106 is coupled to the clamp transistor 112. The switch 106 includes a first current direction selecting transistor 118 and a second current direction selecting transistor 120. The first current direction selecting transistor 118 is part of the first path 114 that includes a first read select transistor 126 that is coupled to the magnetic tunnel junction (MTJ) storage element 108 via a bit line (BL) 140. The second current direction selecting transistor 120 is part of the second path 116 that includes a second read select transistor 128 that is coupled to the MTJ storage element 108 via a source line (SL) 142. In a particular embodiment, both the first read select transistor 126 and the second read select transistor 128 are responsive to a common gate signal 130. The switch 106 may be configured to connect the PMOS load device 110 to the MTJ storage element 108 via one of the first path 114 and the second path 116.

In a particular embodiment, the switch 106 is configured to control a direction of current flow through the MTJ storage element 108 based on a selection signal. The first current selection transistor 118 and the second current selection transistor 120 may respond to the selection signal. In a particular embodiment, the selection signal is a high signal or a low signal. The selection signal may be input directly to the first current direction selecting transistor 118 as a first selection signal 122 and the selection signal may be inverted before being input to the second current direction selecting transistor 120 as a second selection signal 124.

The first current direction selecting transistor 118 may enable access to the first path 114 in response to a first selection signal 122. The second current direction selecting transistor 120 may enable access to the second path 116 in response to the second selection signal 124. The switch 106 may be configured to switch the direction of the current flowing through the MTJ storage element 108 for a read operation. For example, in response to a high selection signal (e.g., the first selection signal 122), the switch 106 may direct the read current from the PMOS load device 110 to the MTJ storage element 108 via the BL 140. A low selection signal may be inverted to generate the second selection signal 124. In response to the second selection signal 124, the switch 106 may direct the read current from the PMOS load device 110 to the MTJ storage element 108 via the SL 142.

In a particular embodiment, the first path 114 includes a first pre-charge transistor 134. The first pre-charge transistor 134 may be responsive to a first pre-charge signal 138. The first pre-charge signal 138 may be based on the selection signal provided to the first current direction selecting transistor 118 and the second current direction selecting transistor 120. For example, a high selection signal may result in the first pre-charge transistor 134 receiving the first pre-charge signal 138. In response to receiving the first pre-charge signal 138, the first pre-charge transistor 134 may be enabled. In a particular embodiment, when the first pre-charge transistor 134 is enabled, the first pre-charge transistor 134 connects the MTJ storage element 108 to a ground and directs the current flow in the first path 114 to the ground.

The MTJ storage element 108 is coupled to both the BL 140 and the SL 142. The MTJ storage element 108 may include multiple MTJ elements, such as a free layer 141, a tunnel layer 143, and a pinned layer 146. In a particular embodiment, the free layer 141 of the MTJ storage element 108 may be coupled to one of the BL 140 and the SL 142. The MTJ storage element 108 may be a device having a first resistance corresponding to a logic "one" value and a second resistance corresponding to a logic "zero" value. For example, the MTJ storage element 108 may be a resistive memory device, such as an MRAM or an STT-MRAM. An access transistor 144 is coupled to the MTJ storage element 108. The access transistor 144 selectively allows current to flow through the MTJ storage element 108 based on a signal $V_{WL}$ 145 that represents a gate voltage.

In response to receiving a high selection signal, the first current direction selecting transistor 118 may enable current to flow from the PMOS load device 110 through the MTJ storage element 108 via the first path 114. The first pre-charge transistor 134 may receive the first pre-charge signal 138 based on the first selection signal 122 to enable the first path 114 to connect to the ground.

In a particular embodiment, the second path 116 includes a second pre-charge transistor 132. The second pre-charge transistor 132 may be responsive to a second pre-charge signal 136. The second pre-charge signal 136 may be based on the selection signal provided to the first current direction selecting transistor 118 and the second current direction selecting transistor 120. For example, a low selection signal may result in the second pre-charge transistor 132 receiving the second pre-charge signal 136. In response to receiving the second pre-charge signal 136, the second pre-charge transistor 132 may be enabled. In a particular embodiment, when the second pre-charge transistor 132 is enabled, the second pre-charge transistor 132 connects the MTJ storage element 108 to ground and directs the current flow in the second path 116 to the ground.

In response to receiving a low selection signal, the second current direction selecting transistor 120 may enable current to flow from the PMOS load device 110 through the MTJ storage element 108 via the second path 116. The second pre-charge transistor 132 may receive the second pre-charge signal 136 based on the second selection signal 124 and enable the second path 116 to connect to the ground. In a particular embodiment, reading the MTJ storage element 108 using the second path 116 may produce an inverted result as the output 160. The output 160 may be adjusted by switching the inputs of the sense amplifier 102, inverting write data to the MTJ storage element 108, or inverting the output 160.

By changing the path between the PMOS load device 110 and the MTJ storage element 108, the sense amplifier 102 may read the MTJ storage element 108 in either a parallelizing direction or an anti-parallelizing direction. Enabling the sense amplifier 102 to read the MTJ storage element 108 in either direction may enable a read current direction to be selected that reduces a probability of a read disturbance during a read operation of the MTJ storage element 108. Reducing the probability of a read disturbance may increase a reliability of the output 160 of the sense amplifier 102.

Figure 2:
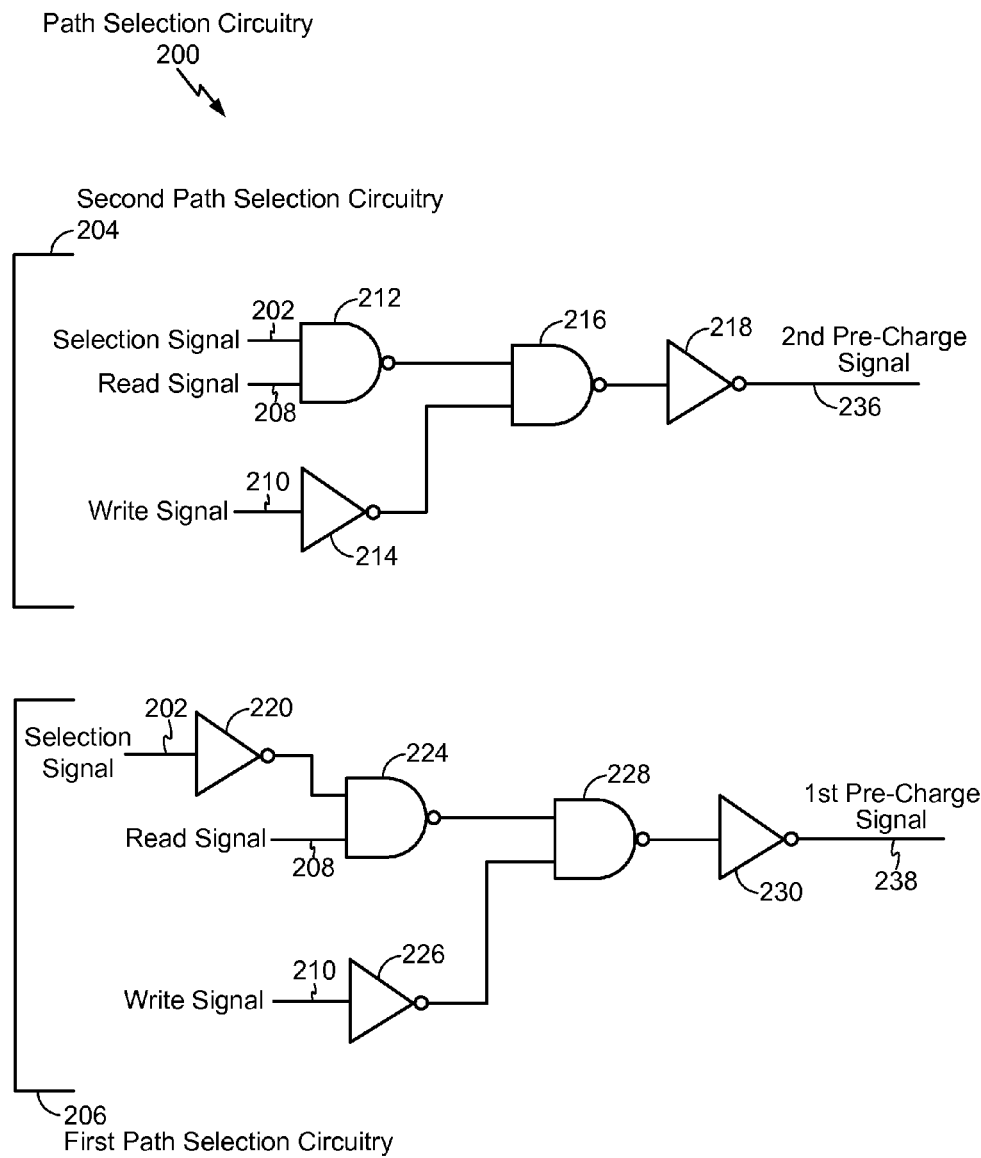
FIG. 2 is a diagram of path selection circuitry that may be used with the circuit of FIG. 1.

Referring to FIG. 2, path selection circuitry is illustrated and generally designated 200. The path selection circuitry 200 includes second path selection circuitry 204 and first path selection circuitry 206. The second path selection circuitry 204 may be configured to transmit a second pre-charge signal 236 based on a selection signal 202 and the first path selection circuitry 206 may be configured to transmit a first pre-charge signal 238 based on the selection signal 202.

In a particular embodiment, the path selection circuitry 200 may be used to transmit the pre-charge signals 138, 136 to the pre-charge transistors 134, 132 of FIG. 1. For example, the second path selection circuitry 204 may transmit the second pre-charge signal 236 to the second pre-charge transistor 132 and the first path selection circuitry 206 may transmit the first pre-charge signal 238 to the first pre-charge transistor 134 of FIG. 1.

In a particular embodiment, the second path selection circuitry 204 includes a first NAND gate 212 that receives the selection signal 202 and a read signal 208. The second path selection circuitry 204 includes a first inverter 214 that receives a write signal 210. An output of the first NAND gate 212 and an output of the first inverter 214 may be coupled as inputs of a second NAND gate 216. An output of the second NAND gate 216 is coupled to a second inverter 218. The output of the second inverter 218 provides the second pre-charge signal 236.

In a particular embodiment, the first NAND gate 212 and the second NAND gate 216 are configured to generate a high output if not all of the inputs are a high signal. The first inverter 214 and the second inverter 218 may be configured to generate a high output if an input is low and to generate a low output if an input is high. For example, in response to a low selection signal (e.g., the selection signal 202) and a high read signal (e.g., the write signal 210), the first NAND gate 212 may generate a high output. In response to a high output from the first NAND gate 212 and a high output from the first inverter 214 (e.g., the write signal 210 is low), the second NAND gate 216 may generate a low output. The second inverter 218 may generate a high output in response to receiving a low input from the second NAND gate 216. In a particular embodiment, the high output of the second inverter 218 is the second pre-charge signal 236.

In a particular embodiment, the first path selection circuitry 206 includes a third NAND gate 224 that receives the read signal 208 and the inverse of the selection signal 202. The selection signal 202 may be inverted by a selection signal inverter 220. The first path selection circuitry 206 includes a third inverter 226 that receives the write signal 210. An output of the third NAND gate 224 and an output of the third inverter 226 may be coupled as inputs of a fourth NAND gate 228. An output of the fourth NAND gate 228 is coupled to a fourth inverter 230. The output of the fourth inverter 230 may provide the first pre-charge signal 238.

In a particular embodiment, the third NAND gate 224 and the fourth NAND gate 228 are configured to generate a high output if not all of the inputs are a high signal. The selection signal inverter 220, the third inverter 226, and the fourth inverter 230 may be configured to generate a high output if an input is low and to generate a low output if an input is high. For example, in response to a high selection signal, the third NAND gate 224 may receive a low signal as output from the selection signal inverter 220. The third NAND gate 224 may generate a high output in response to receiving a low signal from the selection signal inverter 220 and a high read signal 208. In response to a high output from the third NAND gate 224 and a high output from the third inverter 226 (e.g., the write signal 210 is low), the fourth NAND gate 228 may generate a low output. The fourth inverter 230 may generate a high output in response to receiving a low input from the fourth NAND gate 228. In a particular embodiment, the high output of the fourth inverter 230 is the first pre-charge signal 238.

The path selection circuitry 200 may be implemented in the circuit 100 of FIG. 1 to generate the pre-charge signals 136, 138. The pre-charge signals 136, 138 may enable the circuit 100 of FIG. 1 to change a path of a current flow to the MTJ storage element 108. By changing the path between the PMOS load device 110 and the MTJ storage element 108, the sense amplifier 102 may read the MTJ storage element 108 in either a parallelizing direction or an anti-parallelizing direction. Enabling the sense amplifier 102 to read the MTJ storage element 108 in either direction may enable a read current direction to be selected that reduces a probability of a read disturbance during a read operation of the MTJ storage element 108. Reducing the probability of a read disturbance may increase the reliability the output 160 of the sense amplifier 102.

Figure 3:
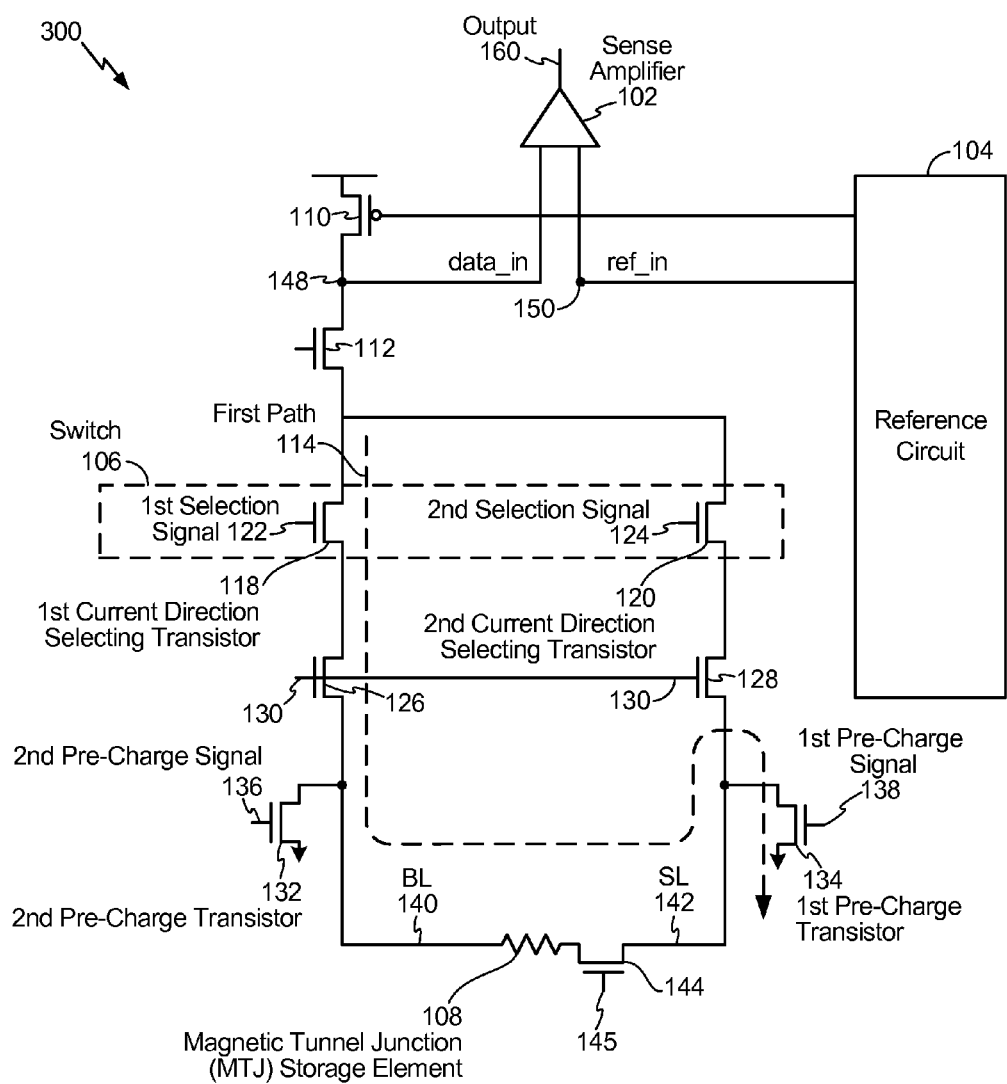
FIG. 3 is a diagram of a second illustrative embodiment of a circuit that controls a direction of a read current to be applied to a magnetic tunnel junction.

Referring to FIG. 3, another embodiment of a circuit to control a direction of a current through an MTJ element is disclosed and generally designated 300. The circuit 300 includes elements of the circuit 100 referred to in FIG. 1, where similar elements have the same reference number.

In response to receiving the first selection signal 122, the first current direction selecting transistor 118 may enable current to flow from the PMOS load device 110 through the MTJ storage element 108 via the first path 114. The first pre-charge transistor 134 may receive the first pre-charge signal 138 based on the first selection signal 122 and enable the first path 114 to connect to the ground.

Read current may flow through the first path 114 from the PMOS load device 110 to the ground via the clamp transistor 112, the first current direction selecting transistor 118, the first read select transistor 126, the MTJ storage element 108, the access transistor 144, and the first pre-charge transistor 134. In a particular embodiment, the current flowing through the MTJ storage element 108 may be one of an anti-parallelizing current direction and a parallelizing current direction. For example, if the free layer of the MTJ storage element 108 is coupled to the BL 140, then the current flowing through the MTJ storage element 108 via the first path 114 may be in a parallelizing direction. Alternatively, if the free layer of the MTJ storage element 108 is coupled to the SL 142, then the current flowing through the MTJ storage element 108 via the first path 114 may be in an anti-parallelizing direction.

Figure 4:
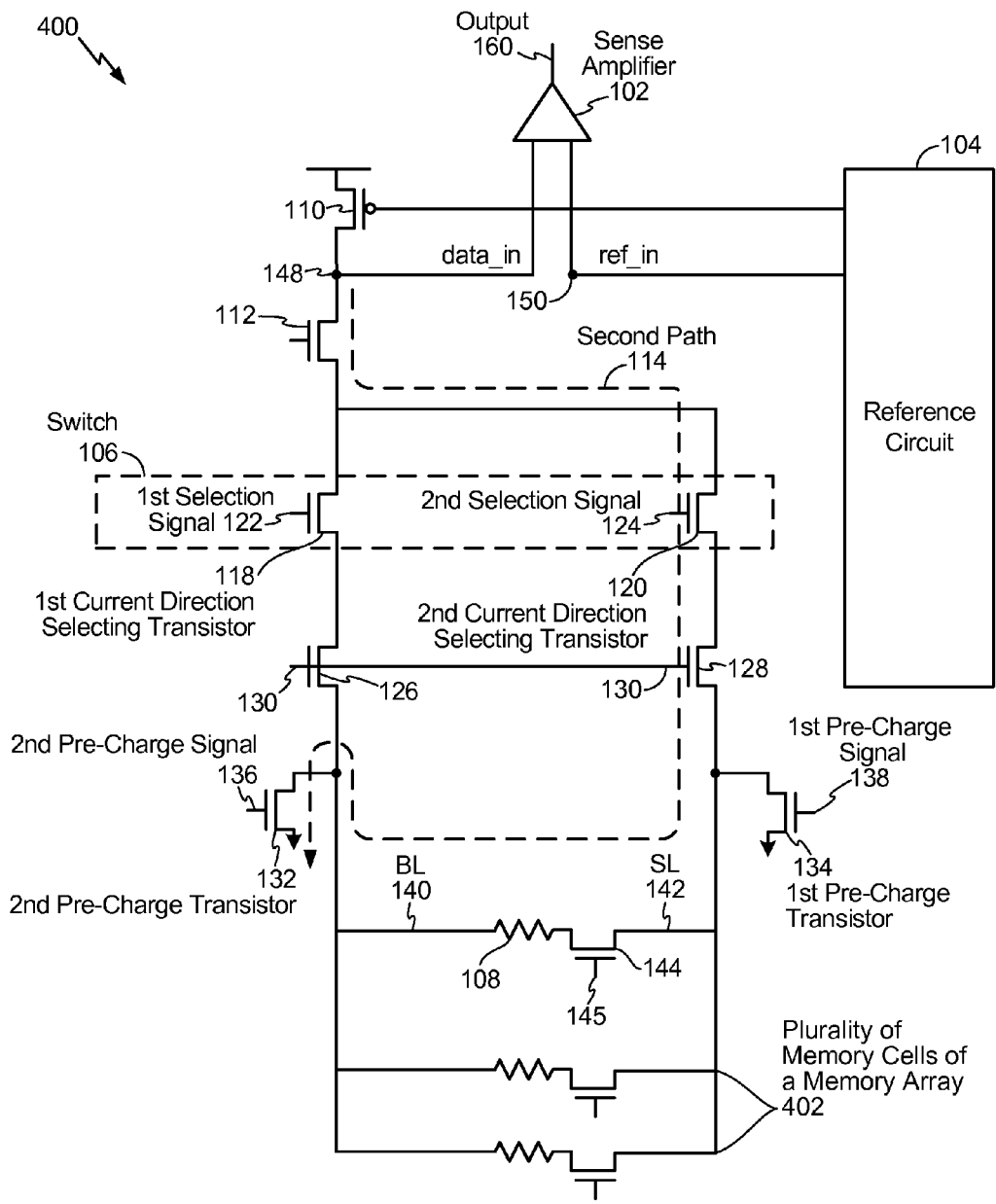
FIG. 4 is a diagram of a third illustrative embodiment of a circuit that controls a direction of a read current to be applied to a magnetic tunnel junction.

Referring to FIG. 4, another embodiment of a circuit to control a direction of a current through an MTJ element is disclosed and generally designated 400. The circuit 400 includes elements of the circuit 100 referred to in FIG. 1, where similar elements have the same reference number. The BL 140 and the SL 142 are coupled to a plurality of memory cells of a memory array 402. The direction of read current flowing through the MTJ storage element 108 and a selected cell of the plurality of memory cells 402 may be one of an anti-parallel current direction and a parallel current direction.

In response to receiving the second selection signal 124, the second current direction selecting transistor 120 may enable current to flow from the PMOS load device 110 through the MTJ storage element 108 via the second path 116. The second pre-charge transistor 132 may receive the second pre-charge signal 136 based on the second selection signal 124 and enable the second path 116 to connect to the ground.

Read current may flow through the second path 116 from the PMOS load device 110 to the ground via the clamp transistor 112, the second current direction selecting transistor 120, the second read select transistor 128, the access transistor 144, the MTJ storage element 108, and the second pre-charge transistor 132. In a particular embodiment, the direction of current flow through the MTJ storage element 108 may be one of an anti-parallelizing current direction and a parallelizing current direction. For example, if the free layer of the MTJ storage element 108 is coupled to the BL 140, then the current flowing through the MTJ storage element 108 via the second path 116 may be in an anti-parallelizing direction. Alternatively, if the free layer of the MTJ storage element 108 is coupled to the SL 142, then the current flowing through the MTJ storage element 108 via the second path 116 may be in a parallelizing direction.

Figure 5:
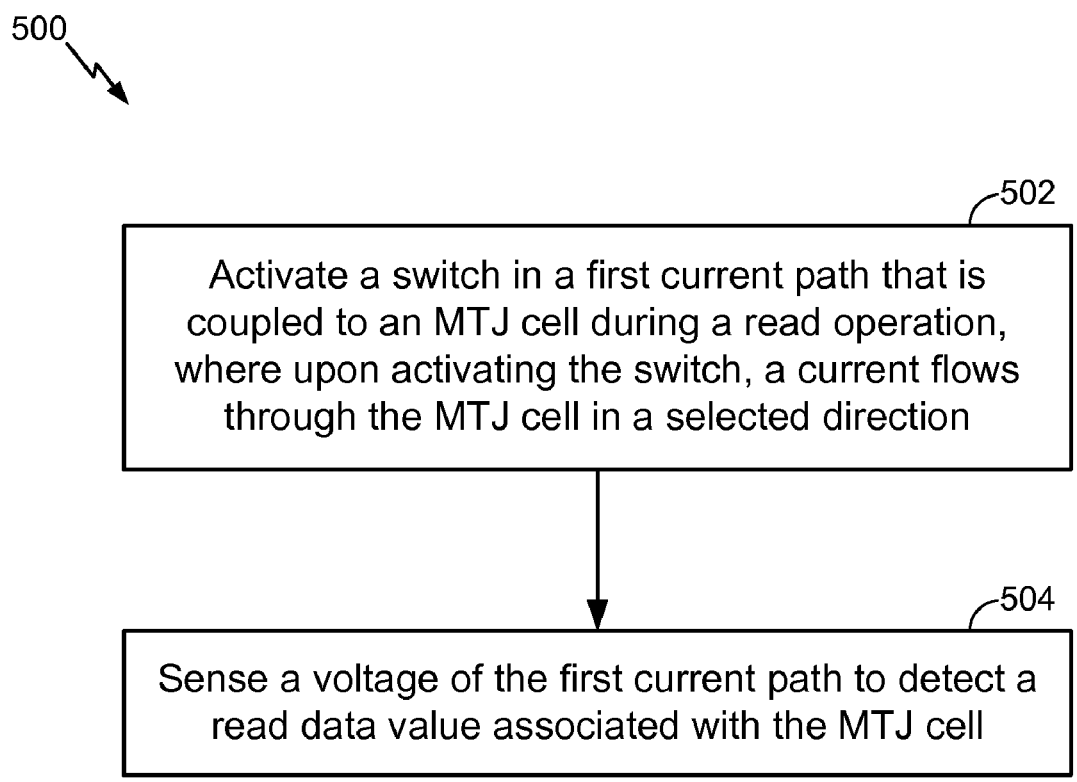
FIG. 5 is a flow chart of a particular illustrative embodiment of a method of controlling a direction of a current to be applied to a magnetic tunnel junction.

FIG. 5 is a flow diagram of an embodiment of a method 500 of controlling a direction of a current to be applied to a magnetic tunnel junction cell of a memory device. In a particular embodiment, the method 500 is performed by any of the systems of FIGS. 1, 3, 4, or any combination thereof. The method 500 includes activating a switch in a first current path that is coupled to an MTJ cell during a read operation, where upon activating the switch, a current flows through the MTJ cell in a selected direction, at 502. For example, the switch 106 of FIGS. 1, 3, and 4 may be activated in the first path 114 that is coupled to the MTJ storage element 108 during a read operation. Upon activating the switch 106, a current flows through the MTJ storage element 108 in a selected direction.

In a particular embodiment, the current is a read current. The current may flow through the MTJ cell in a first direction from a bit line of the MTJ cell to a source line of the MTJ cell. For example, a current of the first path 114 of FIG. 3 flows from the bit line 140 to the source line 142. The current may flow through the MTJ cell in a second direction from a source line of the MTJ cell to a bit line of the MTJ cell. For example, a current of the second path 116 of FIG. 4 flows from the source line 142 to the bit line 140.

In a particular embodiment, the direction of the current is changed from a first direction to a selected direction in response to activating a switch. For example, activating the switch 106 of FIG. 1 may change the direction of a current through the MTJ cell 139. Activating the switch may be performed by a processor integrated into an electronic device. For example, the switch 106 of FIG. 1 may be activated by the digital signal processor 610 of FIG. 6. The switch may include a first current direction selecting transistor responsive to a first current selection signal and a second current direction selecting transistor responsive to a second current selection signal. For example, the switch 106 of FIG. 1 may include the first current direction selecting transistor 118 that is responsive to the first current selection signal 122 and the second current direction selecting transistor 120 that is responsive to the second current selection signal 124. Current may flow in the first current direction when the first current direction selecting transistor receives the first current selection signal and the current flows in the second direction when the second current direction selecting transistor receives the second current selecting signal. For example, in FIG. 1, current may flow in a first direction via the first path 114 when the first current direction selecting transistor 118 receives the first current selection signal 122 and may flow in a second direction via the second path 116 when the second current direction selecting transistor 120 receives the second current selection signal 124.

In a particular embodiment, the method 500 includes sensing a voltage of the first current path to detect a read data value associated with the MTJ cell, at 504. For example, the sense amplifier 102 of FIGS. 1, 3, and 4 senses a voltage of the first path 114 to detect a read data value associated with the MTJ storage element 108. The sense amplifier may be responsive to the MTJ cell. For example, the sense amplifier 102 of FIG. 1 is responsive to the MTJ cell 139.

The method of FIG. 5 may be performed at a processor integrated into an electronic device. For example, as will be described with respect to FIG. 6, the switch 106 of FIG. 1 may be activated by a computer or other electronic device. Alternatively, or in addition, one of skill in the art will recognize that the method 500 of FIG. 5 may be implemented or initiated by a field programmable gate array (FPGA), an application-specific integrated circuit (ASIC), a central processing unit (CPU), a digital signal processor (DSP), a controller, another hardware device, or any combination thereof.

FIG. 6 is a block diagram of an embodiment of a wireless communication device 600 having a circuit that controls a direction of a read current to be applied to an MTJ (e.g., an MTJ read current direction controlling circuit 664). The wireless communication device 600 may be implemented as a portable wireless electronic device that includes a processor 610, such as a digital signal processor (DSP), coupled to a memory 632.

In an illustrative example, the MTJ read current direction controlling circuit 664 includes one or more of the components or circuits of FIGS. 1-4, operates in accordance with FIG. 5, or any combination thereof. The MTJ read current direction controlling circuit 664 may be at the processor 610 or may be a separate device. Although the MTJ read current direction controlling circuit 664 is illustrated integrated with the digital signal processor 610, in other embodiments the MTJ read current direction controlling circuit 664 may be external to the digital signal processor 610.

In a particular embodiment, a display controller 626 is coupled to the processor 610 and to a display device 628. A coder/decoder (CODEC) 634 can also be coupled to the processor 610. A speaker 636 and a microphone 638 can be coupled to the CODEC 634. A wireless controller 640 can be coupled to the processor 610 and to a wireless antenna 642. The read current direction controlling circuit 664 is coupled to the wireless controller 640, the CODEC 634, and the display controller 626. In a particular embodiment, the read current direction controlling circuit 664 is configured to store data related to the display controller 626, the CODEC 634, and the wireless controller 640.

The memory 632 includes software 634, such as instructions that are executable by the processor 610. The memory 632 may include a computer readable medium that stores instructions (e.g., software 634) that are executable by a processor, such as the processor 610. For example, the software 634 may include instructions that are executable by a computer to activate a switch (e.g., the switch 106 of FIG. 1) in a first current path within the MTJ read current direction controlling circuit 664 that is coupled to an MTJ cell during a read operation. Upon activating the switch, a current flows through the MTJ cell in a selected direction. A sense amplifier, such as the sense amplifier 102 of FIG. 1, is configured to sense a voltage of the first current path to detect a read data value associated with the MTJ cell.

In a particular embodiment, the signal processor 610, the display controller 626, the memory 632, the CODEC 634, and the wireless controller 640 are included in a system-in-package or system-on-chip device 622. In a particular embodiment, an input device 630 and a power supply 644 are coupled to the system-on-chip device 622. Moreover, in a particular embodiment, as illustrated in FIG. 6, the display device 628, the input device 630, the speaker 636, the microphone 638, the wireless antenna 642, and the power supply 644 are external to the system-on-chip device 622. However, each of the display device 628, the input device 630, the speaker 636, the microphone 638, the wireless antenna 642, and the power supply 644 can be coupled to a component of the system-on-chip device 622, such as an interface or a controller.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above.

FIG. 7 depicts a particular illustrative embodiment of an electronic device manufacturing process 700. Physical device information 702 is received at the manufacturing process 700, such as at a research computer 706. The physical device information 702 may include design information representing at least one physical property of a semiconductor device, such as the circuit 100 of FIG. 1, the path selection circuitry 200 of FIG. 2, the circuit 300 of FIG. 3, the circuit 400 of FIG. 4, or any combination thereof. For example, the physical device information 702 may include physical parameters, material characteristics, and structure information that is entered via a user interface 704 coupled to the research computer 706. The research computer 706 includes a processor 708, such as one or more processing cores, coupled to a computer readable medium such as a memory 710. The memory 710 may store computer readable instructions that are executable to cause the processor 708 to transform the physical device information 702 to comply with a file format and to generate a library file 712.

In a particular embodiment, the library file 712 includes at least one data file including the transformed design information. For example, the library file 712 may include a library of semiconductor devices including a device that includes the circuit 100 of FIG. 1, a device that includes the circuit 300 of FIG. 3, a device that includes the circuit 400 of FIG. 4, or any combination thereof, that is provided to use with an electronic design automation (EDA) tool 720.

The library file 712 may be used in conjunction with the EDA tool 720 at a design computer 714 including a processor 716, such as one or more processing cores, coupled to a memory 718. The EDA tool 720 may be stored as processor executable instructions at the memory 718 to enable a user of the design computer 714 to design a circuit including a device that includes the circuit 100 of FIG. 1, a device that includes the circuit 300 of FIG. 3, a device that includes the circuit 400 of FIG. 4, or any combination thereof, of the library file 712. For example, a user of the design computer 714 may enter circuit design information 722 via a user interface 724 coupled to the design computer 714. The circuit design information 722 may include design information representing at least one physical property of a semiconductor device, such as a device that includes the circuit 100 of FIG. 1, a device that includes the circuit 300 of FIG. 3, a device that includes the circuit 400 of FIG. 4, or any combination thereof. To illustrate, the circuit design property may include identification of particular circuits and relationships to other elements in a circuit design, positioning information, feature size information, interconnection information, or other information representing a physical property of a semiconductor device.

The design computer 714 may be configured to transform the design information, including the circuit design information 722, to comply with a file format. To illustrate, the file formation may include a database binary file format representing planar geometric shapes, text labels, and other information about a circuit layout in a hierarchical format, such as a Graphic Data System (GDSII) file format. The design computer 714 may be configured to generate a data file including the transformed design information, such as a GDSII file 726 that includes information describing the circuit 100 of FIG. 1, a device that includes the circuit 300 of FIG. 3, a device that includes the circuit 400 of FIG. 4, or any combination thereof, in addition to other circuits or information. To illustrate, the data file may include information corresponding to a system-on-chip (SOC) that includes the circuit 100 of FIG. 1 and that also includes additional electronic circuits and components within the SOC.

The GDSII file 726 may be received at a fabrication process 728 to manufacture the circuit 100 of FIG. 1, a device that includes the circuit 300 of FIG. 3, a device that includes the circuit 400 of FIG. 4, or any combination thereof, according to transformed information in the GDSII file 726. For example, a device manufacture process may include providing the GDSII file 726 to a mask manufacturer 730 to create one or more masks, such as masks to be used with photolithography processing, illustrated as a representative mask 732. The mask 732 may be used during the fabrication process to generate one or more wafers 734, which may be tested and separated into dies, such as a representative die 736. The die 736 includes a circuit including a device that includes the circuit 100 of FIG. 1, a device that includes the circuit 300 of FIG. 3, a device that includes the circuit 400 of FIG. 4, or any combination thereof.

The die 736 may be provided to a packaging process 738 where the die 736 is incorporated into a representative package 740. For example, the package 740 may include the single die 736 or multiple dies, such as a system-in-package (SiP) arrangement. The package 740 may be configured to conform to one or more standards or specifications, such as Joint Electron Device Engineering Council (JEDEC) standards.

Information regarding the package 740 may be distributed to various product designers, such as via a component library stored at a computer 746. The computer 746 may include a processor 748, such as one or more processing cores, coupled to a memory 750. A printed circuit board (PCB) tool may be stored as processor executable instructions at the memory 750 to process PCB design information 742 received from a user of the computer 746 via a user interface 744. The PCB design information 742 may include physical positioning information of a packaged semiconductor device on a circuit board, the packaged semiconductor device corresponding to the package 740 including the circuit 100 of FIG. 1, a device that includes the circuit 300 of FIG. 3, a device that includes the circuit 400 of FIG. 4, or any combination thereof.

The computer 746 may be configured to transform the PCB design information 742 to generate a data file, such as a GERBER file 752 with data that includes physical positioning information of a packaged semiconductor device on a circuit board, as well as layout of electrical connections such as traces and vias, where the packaged semiconductor device corresponds to the package 740 including the circuit 100 of FIG. 1, a device that includes the circuit 300 of FIG. 3, a device that includes the circuit 400 of FIG. 4, or any combination thereof. In other embodiments, the data file generated by the transformed PCB design information may have a format other than a GERBER format.

The GERBER file 752 may be received at a board assembly process 754 and used to create PCBs, such as a representative PCB 756, manufactured in accordance with the design information stored within the GERBER file 752. For example, the GERBER file 752 may be uploaded to one or more machines to perform various steps of a PCB production process. The PCB 756 may be populated with electronic components including the package 740 to form a representative printed circuit assembly (PCA) 758.

The PCA 758 may be received at a product manufacture process 760 and integrated into one or more electronic devices, such as a first representative electronic device 762 and a second representative electronic device 764. As an illustrative, non-limiting example, the first representative electronic device 762, the second representative electronic device 764, or both, may be selected from the group of a set top box, a music player, a video player, an entertainment unit, a navigation device, a communications device, a personal digital assistant (PDA), a fixed location data unit, and a computer, into which the at least one controllable energy consuming module is integrated. As another illustrative, non-limiting example, one or more of the electronic devices 762 and 764 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 7 illustrates remote units according to teachings of the disclosure, the disclosure is not limited to these exemplary illustrated units. Embodiments of the disclosure may be suitably employed in any device which includes active integrated circuitry including memory and on-chip circuitry.

A device that includes the circuit 100 of FIG. 1, a device that includes the circuit 300 of FIG. 3, a device that includes the circuit 400 of FIG. 4, or any combination thereof, may be fabricated, processed, and incorporated into an electronic device, as described in the illustrative process 700. One or more aspects of the embodiments disclosed with respect to FIGS. 1-4 may be included at various processing stages, such as within the library file 712, the GDSII file 726, and the GERBER file 752, as well as stored at the memory 710 of the research computer 706, the memory 718 of the design computer 714, the memory 750 of the computer 746, the memory of one or more other computers or processors (not shown) used at the various stages, such as at the board assembly process 754, and also incorporated into one or more other physical embodiments such as the mask 732, the die 736, the package 740, the PCA 758, other products such as prototype circuits or devices (not shown), or any combination thereof. Although various representative stages of production from a physical device design to a final product are depicted, in other embodiments fewer stages may be used or additional stages may be included. Similarly, the process 700 may be performed by a single entity or by one or more entities performing various stages of the process 700.

Those of skill would further appreciate that the various illustrative logical blocks, configurations, modules, circuits, and method steps described in connection with the embodiments disclosed herein may be implemented as electronic hardware, computer software executed by a processing unit, or combinations of both. Various illustrative components, blocks, configurations, modules, circuits, and steps have been described above generally in terms of their functionality. Whether such functionality is implemented as hardware or executable processing instructions depends on the particular application and design constraints imposed on the overall system. Skilled artisans may implement the described functionality in varying ways with each particular application, but such implementation decisions should not be interpreted as causing a departure from the scope of the present disclosure.

A software module may reside in random access memory (RAM), a magnetoresistive random access memory (MRAM), a spin-torque-transfer MRAM (STT-MRAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
   a magnetic tunnel junction (MTJ) storage element;
   a sense amplifier coupled to a first path, to a second path, and to a reference circuit;
   wherein the first path includes a first current direction selecting transistor and the second path includes a second current direction selecting transistor; and
   wherein the first path is coupled to a bit line of the MTJ storage element and the second path is coupled to a source line of the MTJ storage element.

2. The apparatus of claim 1, wherein the MTJ storage element includes multiple MTJ elements.

3. The apparatus of claim 1, wherein a direction of a current during a read operation is selected based on a selection signal applied to the first current direction selecting transistor and the second current direction selecting transistor.

4. The apparatus of claim 3, wherein the direction of the current between the bit line and the source line is selectable.

5. The apparatus of claim 3, wherein the first current direction selecting transistor enables the current to flow through the first path in response to a first selection signal and the second current direction selecting transistor enables the current to flow through the second path in response to a second selection signal.

6. The apparatus of claim 5, wherein the current flows through a first pre-charge transistor when the first path is selected and the current flows through a second pre-charge transistor when the second path is selected.

7. The apparatus of claim 6, wherein the first pre-charge transistor is responsive to a first pre-charge signal and the second pre-charge transistor is responsive to a second pre-charge signal.

8. The apparatus of claim 7, further comprising a p-channel metal oxide semiconductor (PMOS) transistor.

9. The apparatus of claim 3, wherein the direction of the current is a parallelizing current direction.

10. The apparatus of claim 3, wherein the direction of the current is an anti-parallelizing current direction.

11. The apparatus of claim 1, wherein the MTJ storage element comprises a free layer that is coupled to one of the bit line and the source line.

12. The apparatus of claim 1, wherein the MTJ storage element comprises a magnetoresistive random access memory (MRAM) circuit or a spin torque transfer MRAM (STT-MRAM) circuit.

13. The apparatus of claim 1, wherein the bit line and the source line are coupled to a plurality of memory cells of a memory array.

14. The apparatus of claim 1, integrate in at least one semiconductor die.

15. The apparatus of claim 1, further comprising a device selected from a group consisting of a set top box, a music player, a video player, an entertainment unit, a navigation device, a communications device, a personal digital assistant (PDA), a fixed location data unit, and a computer, into which the sense amplifier is integrated.

16. A method of controlling a direction of a current to be applied to a magnetic tunnel junction (MTJ) cell of a memory device, the method comprising:
activating a switch in a first current path that is coupled to the MTJ cell during a read operation, wherein upon activating the switch, a current flows through the MTJ cell in a selected direction, wherein the direction of the current is changed from a first direction to the selected direction in response to activating the switch, and wherein the switch includes a first current direction selecting transistor and a second current direction selecting transistor.

17. The method of claim 16, further comprising sensing a voltage of the first current path to detect a read data value associated with the MTJ cell.

18. The method of claim 17, wherein the voltage of the first current path is sensed by a sense amplifier.

19. The method of claim 18, wherein the sense amplifier is responsive to the MTJ cell.

20. The method of claim 16, wherein the current is a read current.

21. The method of claim 16, wherein the current flows through the MTJ cell in the first direction from a bit line of the MTJ cell to a source line of the MTJ cell.

22. The method of claim 16, wherein the current flows through the MTJ cell in the selected direction from a source line of the MIT cell to a bit line of the MTJ cell.

23. The method of claim 16, wherein the current flows in the first direction when the first current direction selecting transistor receives a first current direction selection signal and the current flows in the selected direction when the second current direction selecting transistor receives a selecting signal.

24. The method of claim 16, wherein activating the switch is performed by a processor integrated into an electronic device.

25. An apparatus comprising:
means for controlling a direction of a read current of a magnetic tunnel junction (MTJ) cell during a read operation; and
means for sensing a voltage during the read operation to detect a read data value associated with the MTJ cell;
wherein the means for controlling the direction of the read current includes means for activating a switch in a first current path that is coupled to the MTJ cell during the read operation, wherein upon activating the switch, the read current flows through the MTJ cell in a selected direction from a source line of the MTJ cell to a bit line of the MTJ cell.

26. The apparatus of claim 25, integrated in at least one semiconductor die.

27. The apparatus of claim 25, further comprising a device selected from a group consisting of a set top box, a music player, a video player, an entertainment unit, a navigation device, a communications device, a personal digital assistant (PDA), a fixed location data unit, and a computer, into which the MTJ cell is integrated.

28. A method comprising:
a first step for activating a switch in a first current path that is coupled to a magnetic tunnel junction (MTJ) cell during a read operation, wherein upon activating the switch, a current flows through the MTJ cell in a selected direction from a source line of the MTJ cell to a bit line of the MTJ cell; and
a second step for sensing a voltage of the first current path to detect a read data value associated with the MTJ cell.

29. The method of claim 28, wherein the first step and the second step are performed by a processor integrated into an electronic device.

30. A computer readable medium storing instructions executable by a computer, the instructions comprising:
instructions that are executable by the computer to activate a switch in a first current path that is coupled to a magnetic tunnel junction (MTJ) cell during a read operation, wherein upon activating the switch, a current flows through the MTJ cell in a selected direction from a source line of the MTJ cell to a bit line of the MTJ cell; and
wherein a sense amplifier is configured to sense a voltage of the first current path to detect a read data value associated with the MTJ cell.

31. The computer readable medium of claim 30, wherein the instructions are executable by a processor integrated in a device selected from a group consisting of a set top box, a music player, a video player, an entertainment unit, a navigation device, a communication device, a personal digital assistant (PDA), a fixed location data unit, and the computer.

32. A method comprising:
receiving design information representing at least one physical property of a semiconductor device, the semiconductor device including a circuit, the circuit comprising:
a magnetic tunnel junction (MTJ) storage element;
a sense amplifier coupled to a first path, to a second path, and to a reference circuit;

wherein the first path includes a first current direction selecting transistor and the second path includes a second current direction selecting transistor; and wherein the first path is coupled to a bit line of the MTJ storage element and the second path is coupled to a source line of the MTJ storage element;

transforming the design information to comply with a file format; and generating a data file including the transformed design information.

33. The method of claim 32, wherein the data file includes a GDSII format.

34. A method comprising:

receiving a data file including design information corresponding to a semiconductor device; and fabricating the semiconductor device according to the design information, wherein the semiconductor device includes:

a magnetic tunnel junction (MTJ) storage element;

a sense amplifier coupled to a first path, to a second path, and to a reference circuit;

wherein the first path includes a first current direction selecting transistor and the second path includes a second current direction selecting transistor; and wherein the first path is coupled to obit line of the MTJ storage element and the second path is coupled to a source line of the MTJ storage element.

35. The method of claim 34, wherein the data file has a GDSII format.

36. A method comprising:

receiving design information including physical positioning information of a packaged semiconductor device on a circuit board, the packaged semiconductor device including a semiconductor structure comprising:

a magnetic tunnel junction (MTJ) storage element;

a sense amplifier coupled to a first path and to a second path;

wherein the first path includes a first current direction selecting transistor and the second path includes a second current direction selecting transistor; and wherein the first path is coupled to a bit line of the MTJ storage element and the second path is coupled to a source line of the MTJ storage element; and transforming the design information to generate a data file.

37. The method of claim 36, wherein the data file has a GERBER format.

38. A method comprising:

receiving a data file including design information including physical positioning information of a packaged semiconductor device on a circuit board; and manufacturing the circuit board configured to receive the packaged semiconductor device according to the design information, wherein the packaged semiconductor device comprises:

a magnetic tunnel junction (MTJ) storage element;

a sense amplifier coupled to a first path and to a second path;

wherein the first path includes a first current direction selecting transistor and the second path includes a second current direction selecting transistor; and wherein the first path is coupled to a bit line of the MTJ storage element and the second path is coupled to a source line of the MTJ storage element.

39. The method of claim 38, wherein the data file has a GERBER format.

40. The method of claim 38, further comprising integrating the circuit board into a device selected from the group consisting of a set top box, a music player, a video player, an entertainment unit, a navigation device, a communication device, a personal digital assistant (PDA), a fixed location data unit, and a computer.

* * * * *